US009825078B2

United States Patent
Hsieh et al.

(10) Patent No.: US 9,825,078 B2
(45) Date of Patent: Nov. 21, 2017

(54) CAMERA DEVICE HAVING AN IMAGE SENSOR COMPRISING A CONDUCTIVE LAYER AND A REFLECTION LAYER STACKED TOGETHER TO FORM A LIGHT PIPE STRUCTURE ACCOMMODATING A FILTER UNIT

(71) Applicant: VisEra Technologies Company Limited, Hsin-Chu (TW)

(72) Inventors: Chin-Chuan Hsieh, Hsin-Chu (TW); Hao-Min Chen, Chiayi (TW); Wu-Cheng Kuo, Hsin-Chu (TW)

(73) Assignee: Visera Technologies Company Limited, Hsin-Chu (TW)

( * ) Notice: Subject to any disclaimer, the term of this patent is extended or adjusted under 35 U.S.C. 154(b) by 135 days.

(21) Appl. No.: 14/540,675

(22) Filed: Nov. 13, 2014

(65) Prior Publication Data

US 2016/0141321 A1    May 19, 2016

(51) Int. Cl.
*H01L 27/146* (2006.01)

(52) U.S. Cl.
CPC .. *H01L 27/14621* (2013.01); *H01L 27/14623* (2013.01); *H01L 27/14629* (2013.01)

(58) Field of Classification Search
CPC ..... G02B 27/00; G02B 6/0088; H01L 27/146; H01L 31/02; H01L 31/021; H01L 27/14627; H01L 27/1463; H01L 27/14623; G02F 1/13335
USPC ................. 250/208.1, 214 R, 551, 216, 239; 257/432–436; 348/298–311
See application file for complete search history.

(56) References Cited

U.S. PATENT DOCUMENTS

| | | | | |
|---|---|---|---|---|
| 7,683,409 | B2* | 3/2010 | Hong | H01L 27/14601 257/288 |
| 7,768,088 | B2* | 8/2010 | Fukunaga | H01L 27/14625 257/432 |
| 8,946,664 | B2* | 2/2015 | Tsukagoshi | H01L 31/02162 250/239 |
| 2013/0001409 | A1 | 1/2013 | Tsukagoshi et al. | |
| 2015/0034926 | A1* | 2/2015 | Nakata | H01L 51/5234 257/40 |
| 2016/0093658 | A1* | 3/2016 | Hsu | H01L 27/14643 250/208.1 |

FOREIGN PATENT DOCUMENTS

| CN | 1638136 A | 7/2005 |
|---|---|---|
| CN | 101494231 A | 7/2009 |
| CN | 102097445 A | 6/2011 |

(Continued)

OTHER PUBLICATIONS

Taiwanese Office Action dated Jul. 5, 2016 in application No. 103142305, pp. 1-5.

(Continued)

*Primary Examiner* — Que T Le
(74) *Attorney, Agent, or Firm* — Muncy, Geissler, Olds & Lowe, P.C.

(57) ABSTRACT

An image sensor includes a sensing layer, a filter unit, and a conductive layer. The filter unit is disposed on the sensing layer. The conductive layer surrounds the filter unit, and is disposed on the sensing layer. Therefore, light passing through the filter unit and falling on an adjacent sensing unit is minimized, and the image quality of the image sensor is improved.

19 Claims, 8 Drawing Sheets

(56) References Cited

FOREIGN PATENT DOCUMENTS

| | | |
|---|---|---|
| CN | 102683365 A | 9/2012 |
| CN | 102893400 A | 1/2013 |
| CN | 103681710 A | 3/2014 |
| CN | 105308748 A | 2/2016 |
| JP | 2001267544 A | 9/2001 |
| JP | 2006343399 A | 12/2006 |
| JP | 2007088057 A | 4/2007 |
| JP | 2009176949 A | 8/2009 |
| JP | 2009252973 A | 10/2009 |
| JP | 201027234 A | 7/2010 |
| JP | 2010208035 A | 9/2010 |
| JP | 2014049575 A | 3/2014 |
| JP | 2015216186 A | 12/2015 |
| WO | WO 2005/116763 A1 | 8/2005 |

OTHER PUBLICATIONS

Japanese Office Action with its English translation dated May 23, 2016 in application No. 2015-052203, pp. 1-11.
Chinese Office Action with search report from corresponding CN Application No. CN20141788747.8 dated Dec. 30, 2016, 6 pages.
An Office Action from corresponding Japanese Application No. 2015-052203 dated Feb. 6, 2017; 12 pgs.
An Office Action from corresponding CN Application No. 201410788747.8 dated Aug. 28, 2017; 6 pgs.

\* cited by examiner

CAMERA DEVICE HAVING AN IMAGE SENSOR COMPRISING A CONDUCTIVE LAYER AND A REFLECTION LAYER STACKED TOGETHER TO FORM A LIGHT PIPE STRUCTURE ACCOMMODATING A FILTER UNIT

BACKGROUND OF THE INVENTION

Field of the Invention

The present disclosure relates to an image sensor, and in particular to an image sensor having a filter unit and a conductive layer surrounding the filter unit.

Description of the Related Art

In general, a digital camera utilizes an image sensor to sense light and generate an image signal, and thus a picture taken by the digital camera can be generated according to the image signal.

With the development of digital cameras, image signals of high quality of are required. The image sensors using backside illumination (BSI) technology have light pipe structures to guide light to photodiodes. The image sensors have greater photosensitivity and image quality.

Although image sensors have been generally adequate for their intended purposes, they have not been entirely satisfactory in all respects. Consequently, it is desirable to provide a solution for improving image sensors.

BRIEF SUMMARY OF THE INVENTION

The present disclosure provides image sensors for improving the quality of image signals generated by the image sensors.

The present disclosure provides an image sensor including a sensing layer, a filter unit, and a conductive layer. The filter unit is disposed on the sensing layer. The conductive layer surrounds the filter unit, and is disposed on the sensing layer.

The present disclosure provides an image sensor including a sensing layer, a filter unit, a light-shielding layer, and a conductive layer. The filter unit is disposed on the sensing layer. The light-shielding layer surrounds the filter unit, and is disposed on the sensing layer. The conductive layer surrounds the filter unit, and is disposed on the light-shielding layer.

In conclusion, since the filter unit and the conductive layer (or the light-shielding layer) are disposed on the sensing layer, the light passing through the filter unit and falling on an adjacent sensing unit is minimized. Therefore, the image quality of the image sensor is improved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
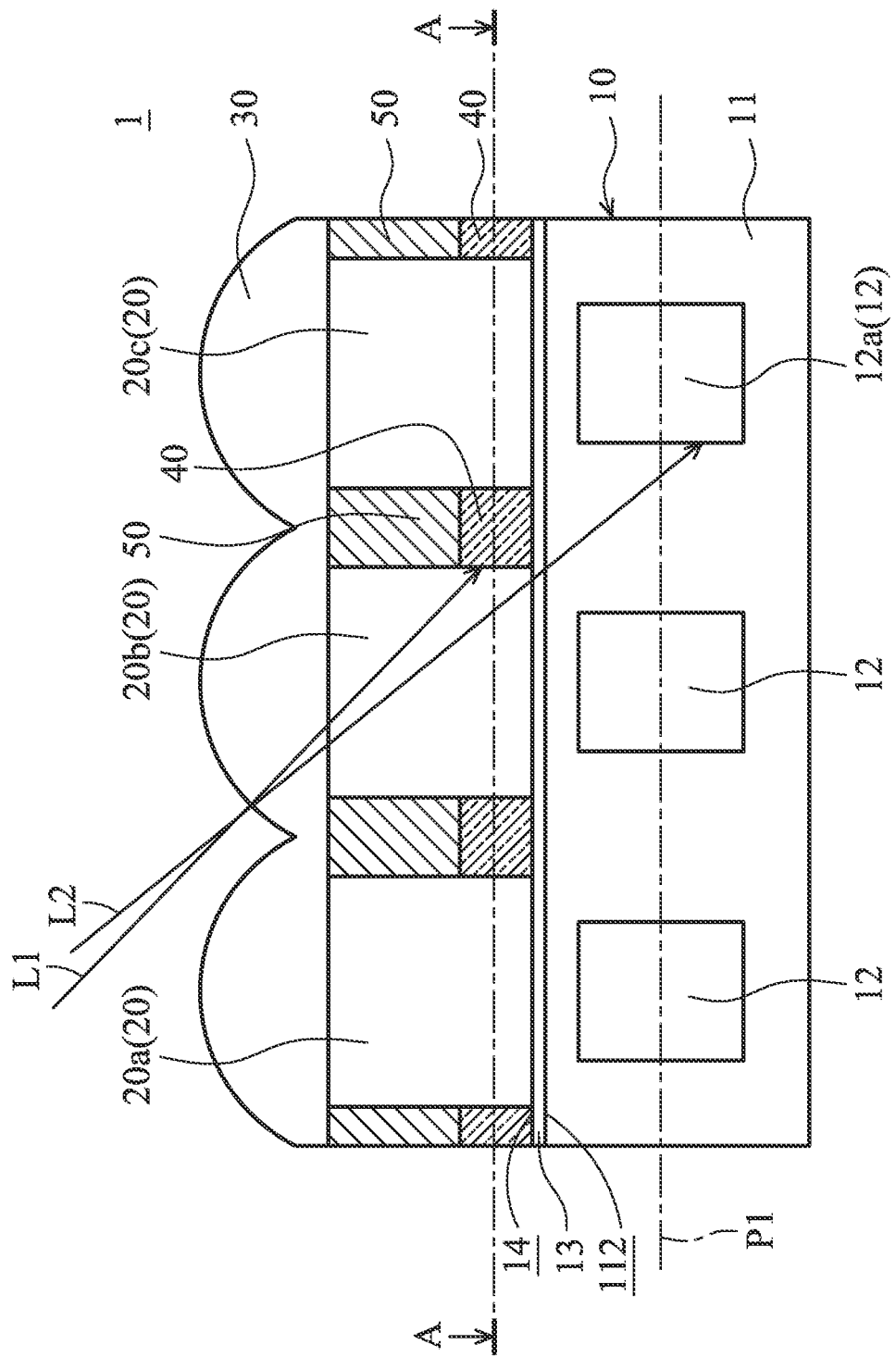
FIG. 1 is a schematic view of an image sensor in accordance with a first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale or simplified for clarity of discussion; rather, these drawings are merely intended for illustration.

Figure 2:
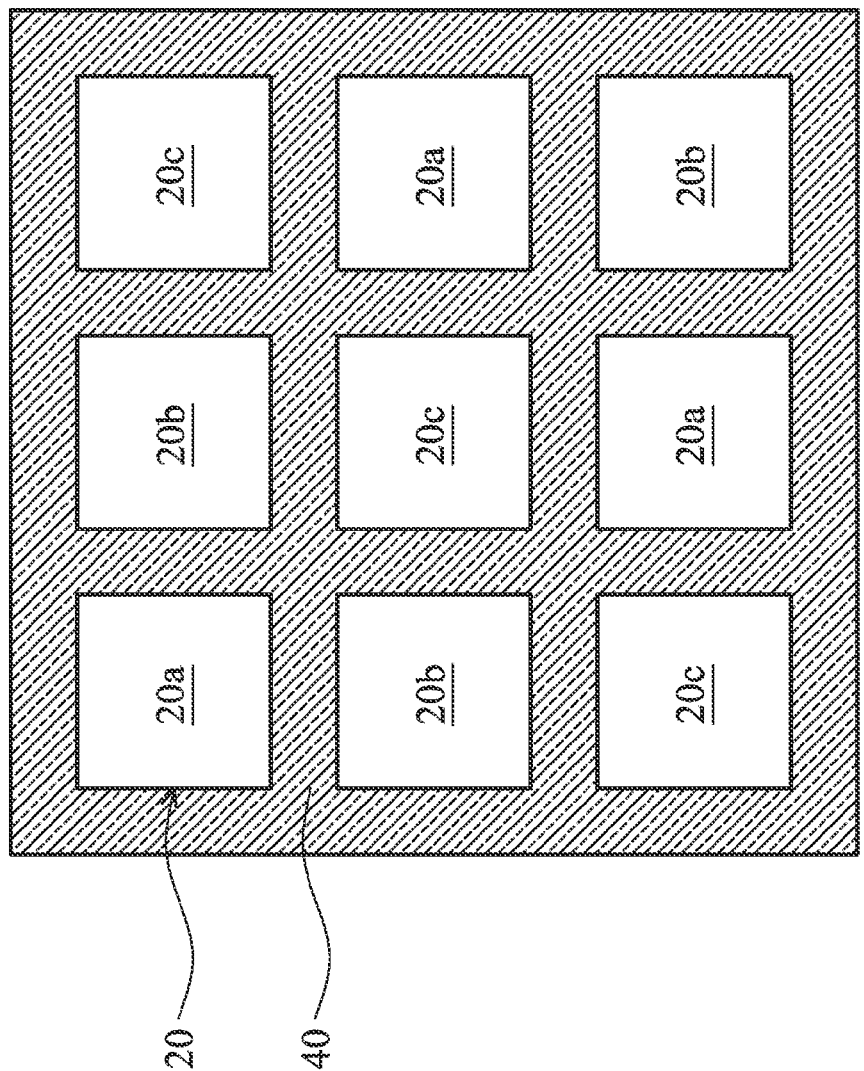
FIG. 2 is a cross-sectional view along the line AA of FIG. 1.

FIG. 1 is a schematic view of an image sensor 1 in accordance with a first embodiment of the present disclosure. FIG. 2 is a cross-sectional view along the line AA of FIG. 1. The image sensor 1 is configured to capture an image. The image sensor 1 can be applied to an imaging apparatus, such as a digital camera. In some embodiments, the image sensor 1 is a CMOS (Complementary Metal-Oxide-Semiconductor) sensor. In some embodiments, the image sensor 1 is a BSI (backside illumination) CMOS sensor.

The image sensor 1 includes a sensing layer 10, a number of filter units 20, a number of microlenses 30, a conductive layer 40, and a reflection layer 50. The sensing layer 10 extends along a reference plane P1. The sensing layer 10 is configured to detect incident light and generate an image signal according to the light falling on the sensing layer 10.

The sensing layer 10 may includes all of the following elements, but the sensing layer 10 is not necessary to include all of the following elements since the object of the sensing layer 10 is achieved. The sensing layer 10 includes a substrate 11, a number of sensing units 12, and an anti-reflection layer 13. In some embodiments, the sensing layer 10 further includes other optional layers (not shown in figures). The sensing units 12 are disposed in the substrate 11. The sensing units 12 are arranged in an array at the reference plane P1. In some embodiments, the sensing units 12 are photodiodes. Each of the sensing units 12 is configured to sense light and generate an intensity signal according to the intensity of the light falling thereon. The image signal is formed by the intensity signals.

The anti-reflection layer 13 is disposed on the substrate 11 and over the sensing units 12. The anti-reflection layer 13 is configured to decrease the reflection of the light transmitting to the sensing units 12. The anti-reflection layer 13 contacts an upper surface 112 of the substrate 11. In other words, the anti-reflection layer 13 extends along the upper surface 112.

The filter units 20 contact the anti-reflection layer 13 of the sensing layer 10. The filter units 20 are arranged in an array on a plane parallel to the reference plane P1. Each of the filter units 20 is disposed over one of the sensing units 12.

Each of the filter units 20 allows a predetermined range of wavelengths of light to pass. In some embodiments, the filter units 20 are color filter units. The filter units 20 include a number of red filter units 20a, a number of green filter units 20b, and a number of blue filter units 20c, as shown in FIG. 2. The red filter units 20a, the green filter units 20b, and the blue filter units 20c are alternately arranged in an array.

The red filter units 20a allow wavelengths of light in a range from 620 nm to 750 nm (red light) to pass to the sensing unit 12. The green filter units 20b allow wavelengths of light in a range from 495 nm to 570 nm (green light) to pass to the sensing unit 12. The blue filter units 20c allow wavelengths of light in a range from 476 nm to 495 nm (blue light) to pass to the sensing unit 12.

The filter unit 20 includes solvent, acryl resin, pigment or a combination thereof. In some embodiments, the filter unit 20 includes at least 70 wt % solvent, acryl resin, pigment or a combination thereof. The filter unit 20 includes a refractive index in a range from about 1.5 to 1.6.

Each of the microlenses 30 is disposed on one of the filter units 20. The microlenses 30 are arranged in an array on a plane parallel to the reference plane P1. The microlenses 30 are configured to focus the light to the sensing units 12. The microlens 30 includes solvent, acryl resin or a combination thereof. In some embodiments, the microlens 30 includes at least 70 wt % solvent, acryl resin or a combination thereof. The microlens 30 includes a refractive index in a range from about 1.5 to 1.7. The microlens 30 has a transmittance higher than 95%.

When a light falls on the image sensor 1, the light passes through the microlenses 30 and the filter units 20 to the sensing units 12. The light is focused by the microlenses 30. Each of the filter units 20 allows a predetermined range of wavelengths of light to pass. Each of the sensing units 12 generates an intensity signal according to the intensity of the light falling thereon, and the image signal is formed by the intensity signals.

The conductive layer 40 surrounds the filter unit 20, and contacts the sensing layer 10 and the filter unit 20. The conductive layer 40 is a grid structure, as shown in FIG. 2, and is parallel to the reference plane P1. In this embodiment, the filter units 20 and the conductive layer 40 contact the anti-reflection layer 13. The conductive layer 40 is configured to couple with a ground wire (not shown) to eliminate static electricity of the image sensor 1.

In some embodiments, the conductive layer 40 is conductive polymeric material. The conductive polymeric material includes polyaniline, polypyrole, polyethylenedioxythiophene, self-doping polyaniline, self-doping polythiophene or a combination thereof. In some embodiments, the conductive polymeric material includes at least 70 wt % polyaniline, polypyrole, polyethylenedioxythiophene, self-doping polyaniline, self-doping polythiophene or a combination thereof.

The conductive layer 40 includes a refractive index in a range from about 1.5 to 1.9. In some embodiments, the conductive layer 40 has a transmittance lower than 20%. The conductive layer 40 has an extinction coefficient greater than 0.01. The conductive layer 40 includes a conductive property in a range from about $10^{-4}$ to $10^{-13}$ s/cm, or $10^{-5}$ to $10^{-13}$ s/cm.

In some embodiments, the conductive layer 40 excludes metals. The conductive layer 40 is thermo/UV cured. In some embodiments, the conductive layer 40 is organic or non-organic polymer base. In some embodiments, the conductive layer is photo or non-photo resist.

As shown in FIG. 1, the filter units 20 and the conductive layer 40 contact the top surface 14 of the sensing layer 10. The light beam L1 has a wide incident angle. The light beam L1 transmitting to an adjacent sensing unit 12a is minimized by the conductive layer 40, since the conductive layer 40 has a transmittance lower than 20% and is adjacent to the top surface 14 of the sensing layer 10. Therefore, the chief ray angle of the image sensor 1 is improved, the optical cross talk of the image sensor 1 is minimized, and thus the image quality of the image sensor 1 is improved.

The reflection layer 50 surrounds the filter unit 20, and disposed on the conductive layer 40. The reflection layer 50 is a grid structure, such as the conductive layer 40. The reflection layer 50 is parallel to the reference plane P1. The filter units 20, the conductive layer 40 and the reflection layer 50 form a light pipe structure.

In this embodiment, the reflection layer 50 contacts the conductive layer 40 and the filter unit 20. Moreover, the microlenses 30 contact the reflection layer 50 and the filter units 20. The reflection layer 50 is configured to reflect the light in the filter unit 20 toward the sensing units 12. In some embodiments, the reflection layer 50 reflects the light by total internal reflection. The reflection layer 50 prevents the light to an adjacent filter unit 20 by passing through the reflection layer 50.

In some embodiments, the reflection layer 50 includes propylene, polysiloxane or a combination thereof. In some embodiments, the reflection layer 50 includes at least 70 wt % propylene, polysiloxane or a combination thereof. The reflection layer 50 excludes metals or is insulation. In some embodiments, the reflection layer 50 has a transmittance greater than 80% or 90%.

In some embodiments, the refractive index of the reflection layer 50 is lower than 1.45. The refractive index of the reflection layer 50 is lower than the refractive index of the filter unit 20. In some embodiments, the refractive index of the reflection layer 50 is lower than the refractive index of the conductive layer 40. The refractive index of the conductive layer 40 is lower than the refractive index of the filter unit 20.

In some embodiments, the light beam L2 has a wide incident angle. The light beam L2 may transmit to the adjacent sensing unit 12a via the top surface 14 of the substrate 11.

Figure 3:
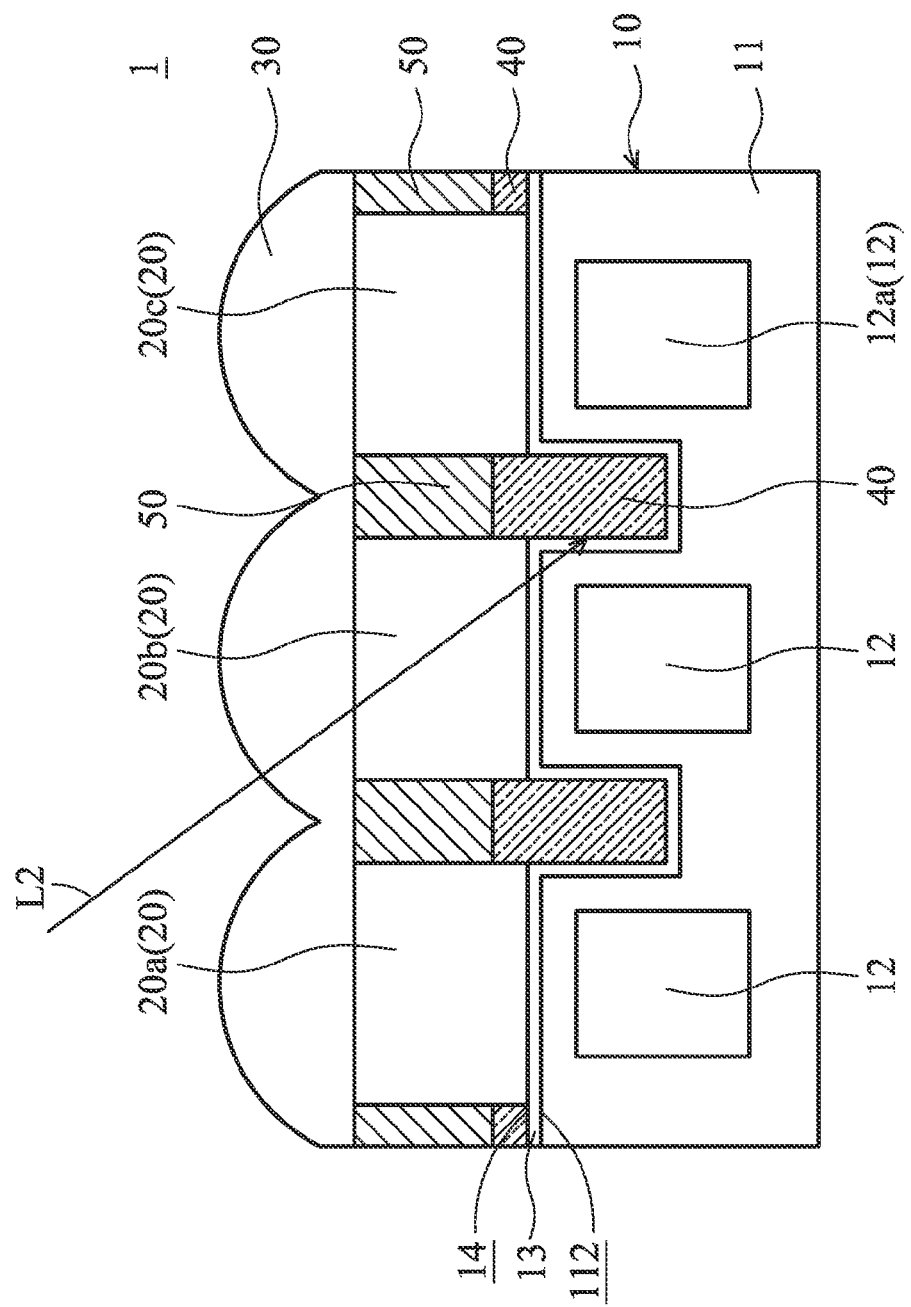
FIG. 3 is a schematic view of an image sensor in accordance with a second embodiment of the present disclosure.

FIG. 3 is a schematic view of an image sensor 1 in accordance with a second embodiment of the present disclosure. The substrate 11 has a number of grooves 15 formed on the top surface 14. The anti-reflection layer 13 is located in the bottom and the wall of groove 15. In other words, the anti-reflection layer 13 extents along the upper surface 112 and the groove 15. In some embodiments, the anti-reflection layer 13 is not located in the groove 15.

The conductive layer 40 is located in the groove 15, and contacts the anti-reflection layer 13 in the groove 15. In other words, the groove 15 is filled with the conductive layer 40, and the conductive layer 40 protrudes through the top surface 14. Since the conductive layer 40 is a grid structure, the conductive layer 40 is also surrounding the sensing unit 12.

Since the conductive layer 40 extends under the top surface 14 and surrounds the sensing unit 12, the light beam L2 transmitting to an adjacent sensing unit 12*a* via the top surface 14 is minimized by the conductive layer 40. Therefore, the chief ray angle of the image sensor 1 is further improved, and the optical cross talk of the image sensor 1 is further minimized.

Figure 4A:
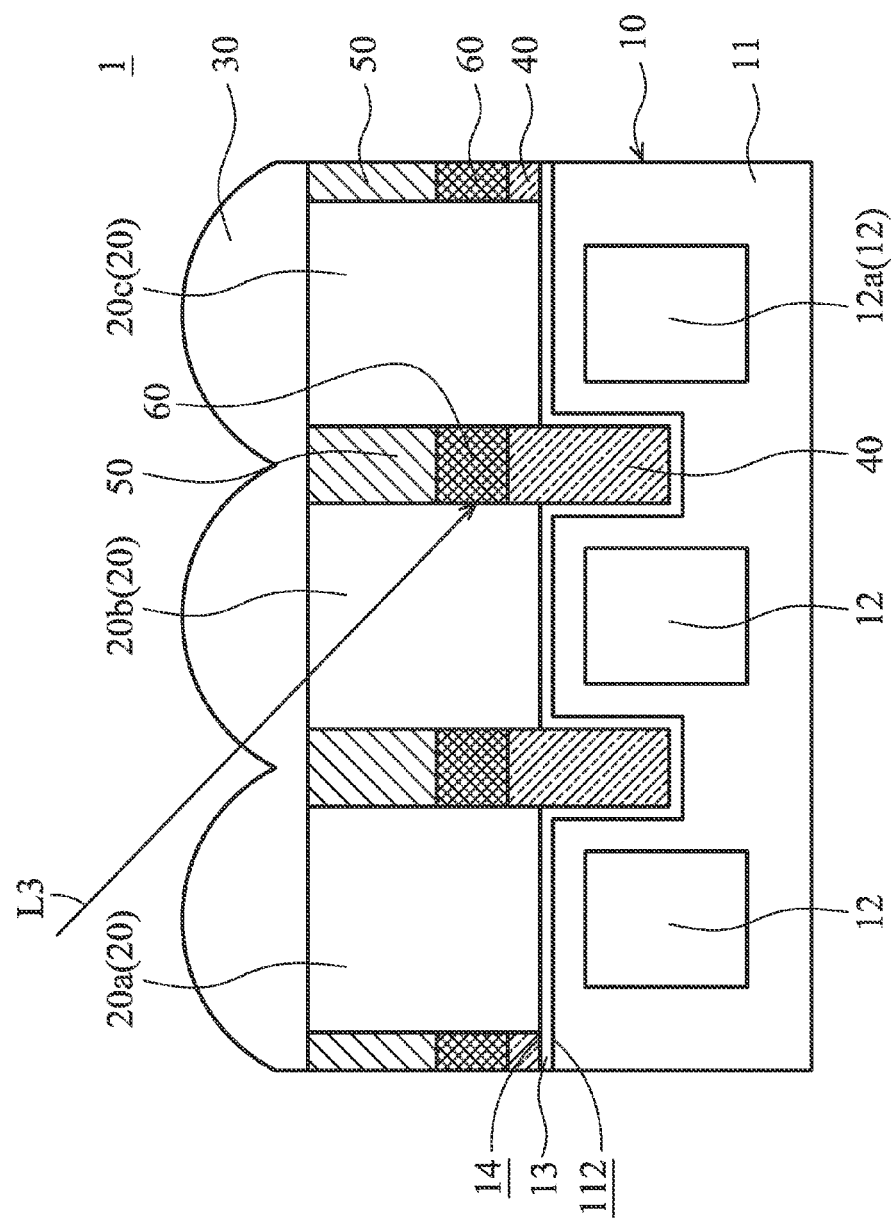
FIG. 4A is a schematic view of an image sensor in accordance with a third embodiment of the present disclosure.

FIG. 4A is a schematic view of an image sensor 1 in accordance with a third embodiment of the present disclosure. The image sensor 1 further includes a light-shielding layer 60. The light-shielding layer 60 surrounds the filter units 20, and is located between the reflection layer 50 and the sensing layer 10. The light-shielding layer 60 contacts the reflection layer 50, the conductive layer 40, and the filter units 20. The light-shielding layer 60 is a grid structure, such as the conductive layer 40. The light-shielding layer 60 and parallel to the reference plane P1.

In some embodiments, the light-shielding layer 60 includes solvent, acryl resin, pigment or a combination thereof. In some embodiments, the light-shielding layer 60 includes at least 70 wt % solvent, acryl resin, pigment or a combination thereof. The light-shielding layer 60 excludes metals or is insulation.

The light-shielding layer 60 includes a refractive index in a range from about 1.5 to 1.6. The refractive index of the reflection layer 50 is lower than the refractive index of the light-shielding layer 60. In some embodiments, the refractive index of the light-shielding layer 60 is greater than or equal to the refractive index of the conductive layer 40. The refractive index of the light-shielding layer 60 is almost equal to the refractive index of the filter unit 20.

In some embodiments, the light-shielding layer 60 has a transmittance lower than 5%. In some embodiments, the light-shielding layer 60 is black. In some embodiments, the conductive layer 40 has a transmittance in a range from a 50% to 80%.

A shown in FIG. 4A, the light beam L3 has a wide incident angle. The light beam L3 transmitting to an adjacent sensing unit 12*a* is minimized by the light-shielding layer 60, since the light-shielding layer 60 has a transmittance lower than 20%. Therefore, the chief ray angle of the image sensor 1 is improved, and the optical cross talk of the image sensor 1 is minimized.

Figure 4B:
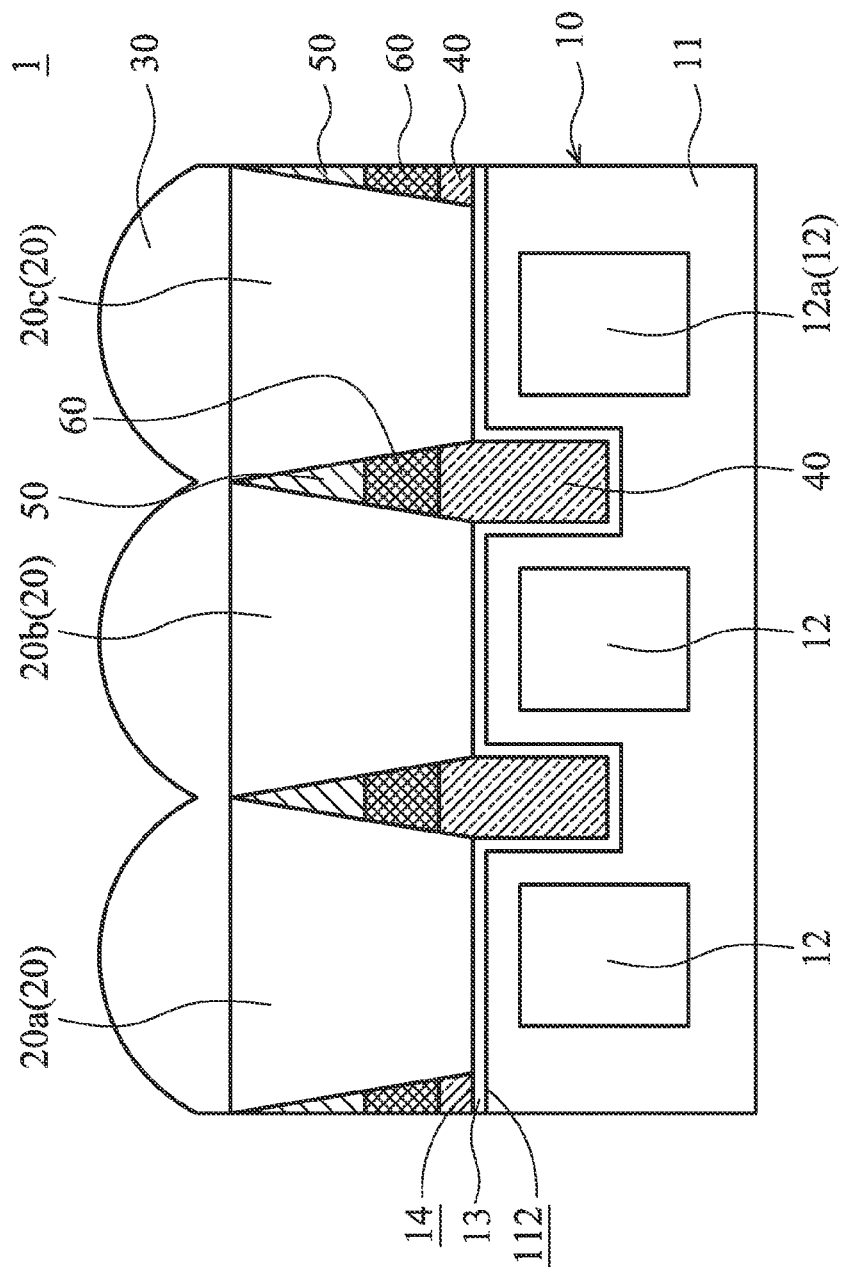
FIG. 4B is a schematic view of an image sensor in accordance with a fourth embodiment of the present disclosure.

FIG. 4B is a schematic view of an image sensor 1 in accordance with a fourth embodiment of the present disclosure. In the embodiments, the filter unit 20 is gradually wider from the bottom portion of the filter unit 20 adjacent to the sensing layer 10 to the top portion of the filter unit 20 adjacent to the microlens 30.

Accordingly, the conductive layer 40 is gradually narrower from the portion of the conductive layer 40 close to the sensing layer 10 to the portion of the conductive layer 40 close to the microlens 30. The reflection layer 50 gradually narrower from the bottom portion of the reflection layer 50 close to the sensing layer 10 to the top portion of the reflection layer 50 close to the microlens 30. The light-shielding layer 60 gradually narrower from the bottom portion of the light-shielding layer 60 close to the sensing layer 10 to the top portion of the light-shielding layer 60 close to the microlens 30.

Since the top opening of the filter unit 20 is wider, the chief ray angle of the image sensor 1 is further improved.

Figure 5:
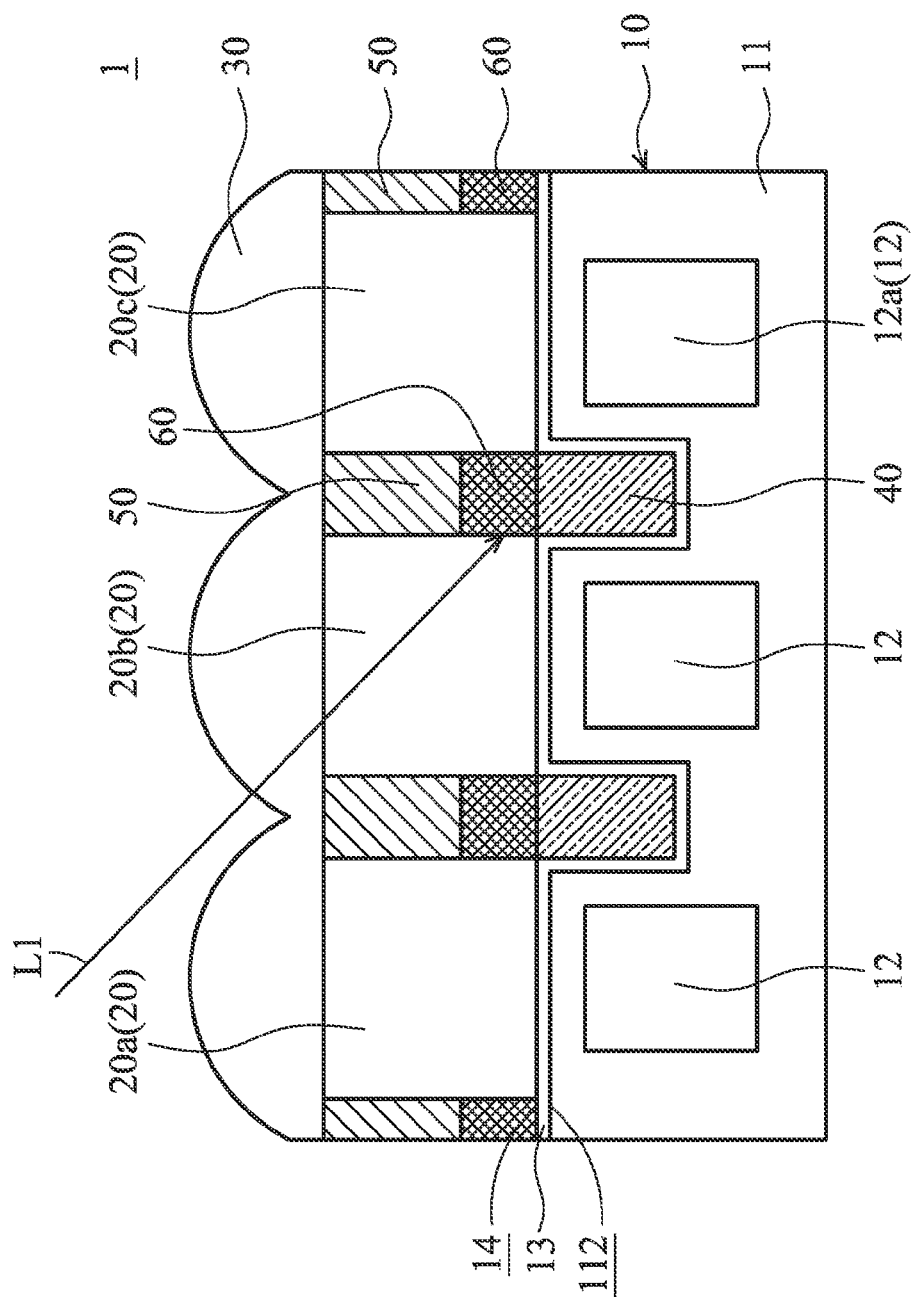
FIG. 5 is a schematic view of an image sensor in accordance with a fifth embodiment of the present disclosure.

FIG. 5 is a schematic view of an image sensor 1 in accordance with a fifth embodiment of the present disclosure. The conductive layer 40 is located in the groove 15, and contacts the top surface 14. In other words, the conductive layer 40 does not protrude through the top surface 14.

The light beam L1 has an incident angle greater than the light beam L3 as shown in FIG. 4. The light beam L1 transmitting to an adjacent sensing unit 12*a* is minimized by the light-shielding layer 60 adjacent to the top surface 14 of the sensing layer 10.

Figure 6:
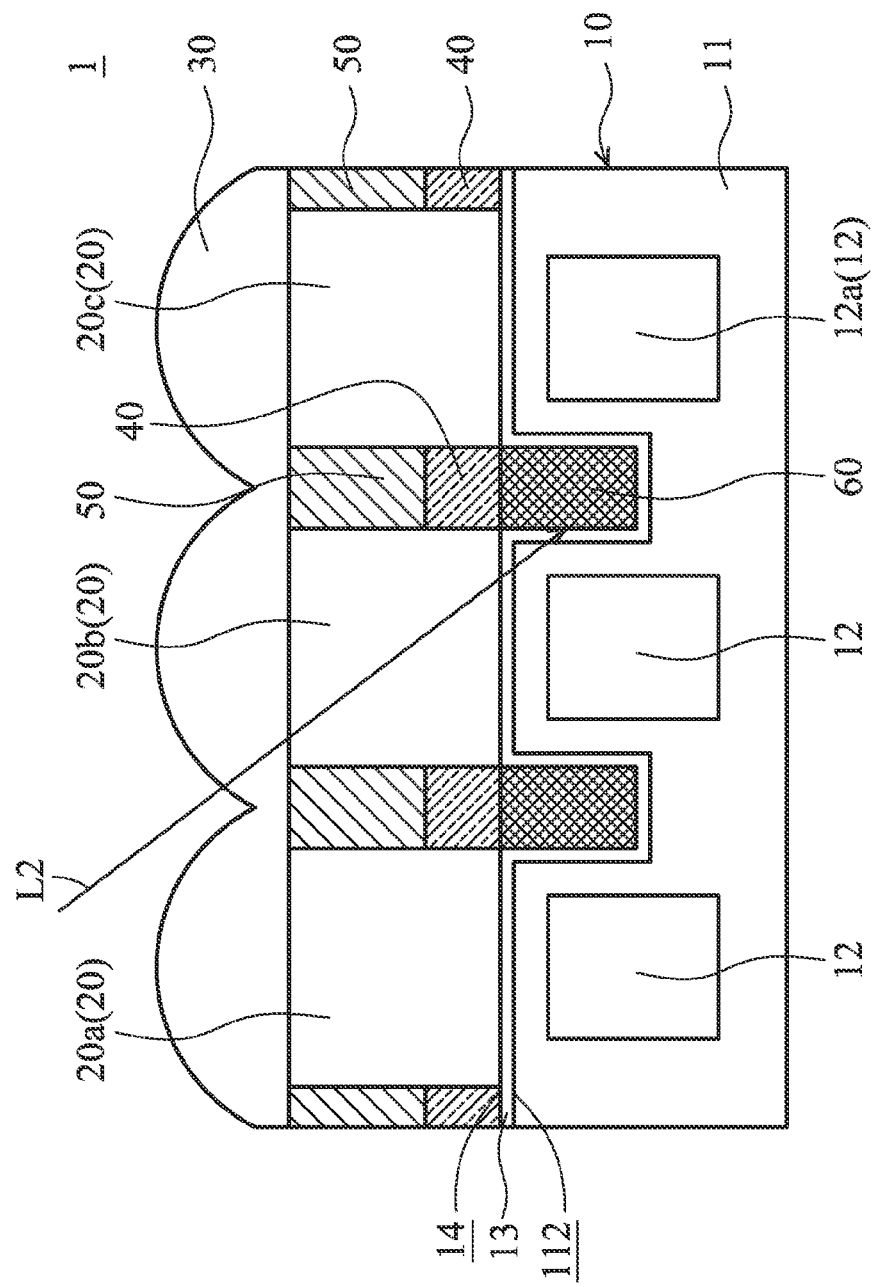
FIG. 6 is a schematic view of an image sensor in accordance with a sixth embodiment of the present disclosure.

FIG. 6 is a schematic view of an image sensor 1 in accordance with a sixth embodiment of the present disclosure. The light-shielding layer 60 surrounds the sensing units 12, and contacting the sensing layer 10. The light-shielding layer 60 is located in the groove 15. The light-shielding layer 60 is located in the groove 15, and contacts the top surface 14. In other words, the light-shielding layer 60 does not protrude through the top surface 14. In some embodiments, the light-shielding layer 60 protrudes through the top surface 14, and surrounds the filter units 20.

The conductive layer 40 surrounds the filter unit 20, and disposed on the light-shielding layer 60. The reflection layer 50 surrounds the filter unit 20, and is disposed over the conductive layer 40.

The light beam L2 transmitting to an adjacent sensing unit 12*a* is minimized by the light-shielding layer 60.

Figure 7:
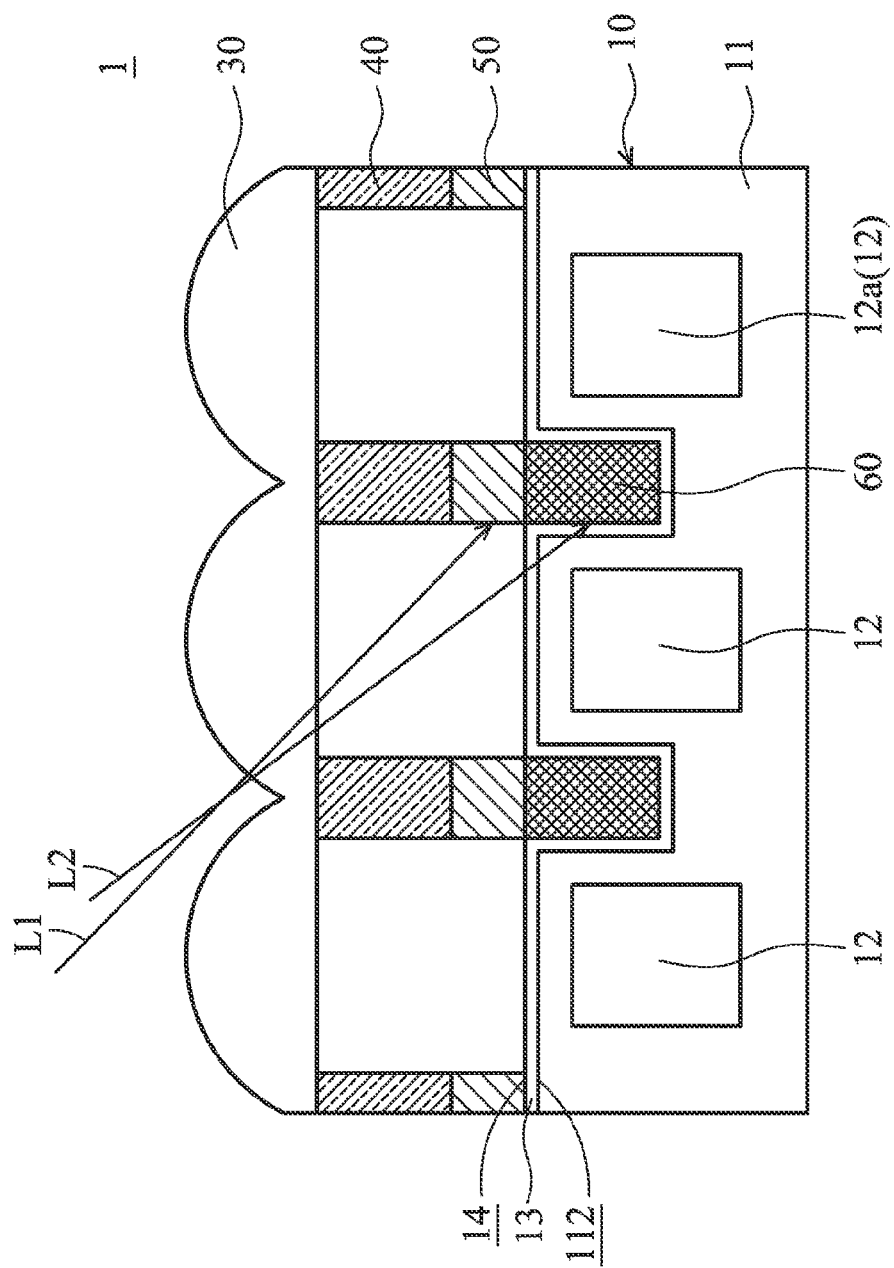
FIG. 7 is a schematic view of an image sensor in accordance with a seventh embodiment of the present disclosure.

FIG. 7 is a schematic view of an image sensor 1 in accordance with a seventh embodiment of the present disclosure. The reflection layer 50 surrounds the filter unit 20, and disposed on the light-shielding layer 60. Moreover, the reflection layer 50 is located between the light-shielding layer 60 and the conductive layer 40. The conductive layer 40 surrounds the filter unit 20, and disposed on the reflection layer 50. Since the conductive layer 40 is located at an upper portion of the image sensor 1, the conductive layer 40 easily couples with a ground wire and eliminates static electricity of the image sensor 1.

In conclusion, since the filter unit and the conductive layer (or the light-shielding layer) are disposed on the sensing layer, the light passing through the filter unit and falling on an adjacent sensing unit is minimized. Therefore, the image quality of the image sensor is improved.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a sensing layer;
   a filter unit disposed on the sensing layer;
   a conductive layer, surrounding and contacting the filter unit, and disposed on the sensing layer; and
   a reflection layer, surrounding and contacting the filter unit, and disposed on the conductive layer,
   wherein the conductive layer and the reflection layer stacked together form a light pipe structure accommodating the filter unit so as to allow light transmitting to the sensing layer and minimize light passing through the filter unit.

2. The image sensor as claimed in claim 1, wherein the conductive layer is conductive polymeric material.

3. The image sensor as claimed in claim 2, wherein the conductive polymeric material includes polyaniline, polypyrole, polyethylenedioxythiophene, self-doping polyaniline, self-doping polythiophene, or a combination thereof.

4. The image sensor as claimed in claim 1, wherein the conductive layer has a transmittance lower than 20%.

5. The image sensor as claimed in claim 1, wherein the reflection layer has a transmittance greater than 80% and a refractive index lower than 1.45.

6. The image sensor as claimed in claim 1, further comprising a light-shielding layer, surrounding the filter unit, located between the reflection layer and the sensing layer.

7. The image sensor as claimed in claim 6, wherein the light-shielding layer has a transmittance lower than 20%.

8. The image sensor as claimed in claim 1, wherein the sensing layer has a groove, and the conductive layer is located in the groove.

9. The image sensor as claimed in claim 1, wherein a sensing layer comprises:
   a substrate;
   a sensing unit, disposed in the substrate; and
   an anti-reflection layer, disposed on the substrate and over the sensing unit.

10. An image sensor, comprising:
    a sensing layer;
    a filter unit disposed on the sensing layer;
    a light-shielding layer, surrounding and contacting the filter unit, disposed on the sensing layer;
    a conductive layer, surrounding and contacting the filter unit, disposed on the light-shielding layer; and
    a reflection layer, surrounding and contacting the filter unit,
    wherein the light-shielding layer, the conductive layer and the reflection layer stacked together form a light pipe structure accommodating the filter unit so as to allow light transmitting to the sensing layer and minimize light passing through the filter unit.

11. The image sensor as claimed in claim 10, wherein the conductive layer is conductive polymeric material.

12. The image sensor as claimed in claim 11, wherein the conductive polymeric material includes polyaniline, polypyrole, polyethylenedioxythiophene, self-doping polyaniline, self-doping polythiophene, or the combination thereof.

13. The image sensor as claimed in claim 10, wherein the light-shielding layer has a transmittance lower than 20%.

14. The image sensor as claimed in claim 10, wherein the reflection layer is disposed on the conductive layer.

15. The image sensor as claimed in claim 14, wherein the reflection layer has a transmittance greater than 80% and a refractive index lower than 1.45.

16. The image sensor as claimed in claim 10, wherein the reflection layer is located between the light-shielding layer and the conductive layer.

17. The image sensor as claimed in claim 16, wherein the reflection layer has a transmittance greater than 80% and a refractive index lower than 1.45.

18. The image sensor as claimed in claim 10, wherein the substrate has a groove, and the light-shielding layer is located in the groove.

19. The image sensor as claimed in claim 10, wherein a sensing layer comprises:
    a substrate;
    a sensing unit, disposed in the substrate; and
    an anti-reflection layer, disposed on the substrate and over the sensing unit.

\* \* \* \* \*